(12) United States Patent
Hojabri et al.

(10) Patent No.: US 6,278,324 B1
(45) Date of Patent: Aug. 21, 2001

(54) ANALOG AMPLIFIER WITH MONOTONIC TRANSFER FUNCTION

(75) Inventors: Peyman Hojabri, San Jose; Andrew Morrish, Saratoga, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/429,411

(22) Filed: Oct. 28, 1999

(51) Int. Cl.[7] .................................................. H03G 3/30
(52) U.S. Cl. ............................................. 330/284; 330/282
(58) Field of Search .................... 330/254, 282, 330/284

(56) References Cited

U.S. PATENT DOCUMENTS 5,828,265  10/1998  Mensink et al. ...................... 327/563
5,936,470 *  8/1999  Stroud ................................. 330/284

* cited by examiner

*Primary Examiner*—Steven J. Mottola
(74) *Attorney, Agent, or Firm*—Mark A. Dalla Valle; Wildman, Harrold, Allen & Dixon

(57) ABSTRACT

An analog amplifier with a monotonic transfer function converts an incoming analog control voltage into multiple continuously variable discrete analog control voltages which are then used to control the respective gate biases of multiple MOS transistors. The MOS transistors are each connected in series with respective associated resistors and in a laddered parallel configuration with other serial transistor-resistor pairs. This creates a variable impedance circuit which, in accordance with the continuously variable discrete analog control voltages, exhibits a corresponding continuously variable circuit impedance in the form of a continuously variable resistance. This variable resistance forms part of the feedback circuit for controlling the gain of a noninverting operational amplifier circuit. This causes the ratio of the analog output and input signals of such operational amplifier circuit to define a monotonic transfer function. Also included is a shunt input signal attenuator that uses a current mirror circuit to generate a sink current which is proportional to the analog control voltage and is drawn from the input signal source via the input signal terminal.

11 Claims, 4 Drawing Sheets

ANALOG AMPLIFIER WITH MONOTONIC TRANSFER FUNCTION

BACKGROUND OF THE INVENTION

1. Field of the Invention

The present invention relates to analog amplifier circuits with variable signal gain, and in particular, to analog amplifier circuits having variable signal gain according to a monotonic transfer function.

2. Description of the Related Art

Analog amplifier circuits with variable signal gains are used in many applications. One of many examples would be the numerous analog amplifier circuits needed in a video system for processing, conditioning and displaying the video image signals. Indeed, video circuits in particular require such amplifier circuits to have truly monotonic transfer functions with respect to the signal gains. Any nonlinearities or discontinuities in the transfer function can introduce significant signal errors, particularly in high resolution color image displays.

Accordingly, it would be desirable to have an analog amplifier circuit with a variable gain according to a monotonic transfer function and a simple and reliable circuit structure.

SUMMARY OF THE INVENTION

An amplifier with a monotonic transfer function in accordance with the present invention converts an incoming control signal into multiple continuously variable discreet analog control signals for controlling multiple continuously variable circuit impedances connected in a laddered parallel configuration to produce a single continuously variable circuit impedance. This continuously variable circuit impedance, in turn, is used to control the gain of a variable gain amplifier circuit whose transfer function is impedance-dependent. This produces a transfer function which is monotonic. Additionally, a shunt signal attenuation circuit at the input terminal provides additional amplitude control directly for the input signal.

In accordance with one embodiment of the present invention, an amplifier with a monotonic transfer function includes a control signal generator circuit and a variable gain amplifier circuit. The control signal generator circuit is configured to receive a variable input control signal and in accordance therewith generate a plurality of continuously variable discrete analog output control signals having a plurality of respective continuously variable output control signal values including a minimum value, one or more successively greater intermediate values and a maximum value. The variable gain amplifier circuit, coupled to the control signal generator circuit, is configured to receive the plurality of continuously variable discrete analog output control signals and in accordance therewith receive and amplify an analog input signal and in accordance therewith generate an analog output signal, wherein a ratio of the analog output signal and the analog input signal defines a monotonic transfer function.

In accordance with another embodiment of the present invention, the amplifier further includes an input terminal and a shunt signal attenuation circuit. The input terminal, coupled to the variable gain amplifier circuit, is configured to receive from a signal source and convey the analog input signal with an analog input signal magnitude. The shunt signal attenuation circuit, coupled to the input terminal, is configured to receive the variable input control signal and in accordance therewith generate a sink current which has a sink current magnitude and is drawn from the signal source via the input terminal, wherein the sink current and analog input signal magnitudes vary in relation to the variable input control signal.

In accordance with still another embodiment of the present invention, an amplifier circuit with a shunt input signal attenuator includes an input terminal, an amplifier circuit and a shunt signal attenuation circuit. The input terminal is configured to receive from a signal source and convey an input signal having an input signal magnitude. The amplifier circuit has a predetermined signal gain and is configured to receive and amplify the input signal. The shunt signal attenuation circuit, coupled to the input terminal, is configured to receive a variable control signal and in accordance therewith generate a sink current which has a sink current magnitude and is drawn from the signal source via the input terminal, wherein the sink current and input signal magnitudes vary in relation to the variable control signal.

These and other features and advantages of the present invention will be understood upon consideration of the following detailed description of the invention and the accompanying drawings.

DETAILED DESCRIPTION OF THE INVENTION

Figure 1:
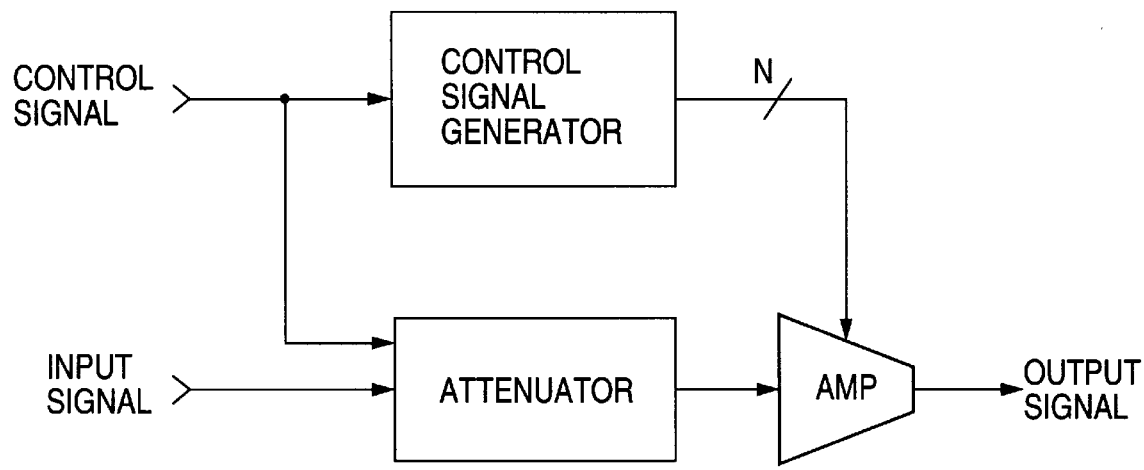
FIG. 1 is a functional block diagram of an amplifier with a monotonic transfer function in accordance with one embodiment of the present invention.

Referring to FIG. 1, an amplifier with a monotonic transfer function in accordance with one embodiment of the present invention includes three basic functional stages: a control signal generator; an input attenuator; and a variable gain amplifier. The input signal is selectively attenuated by an input attenuator circuit prior to being amplified by the amplifier circuit. The gain, or transfer function, of the amplifier is controlled by N control signals provided by the control signal generator in accordance with the single input signal control signal. This control signal also controls the attenuation provided by the input signal attenuator.

Figure 2:
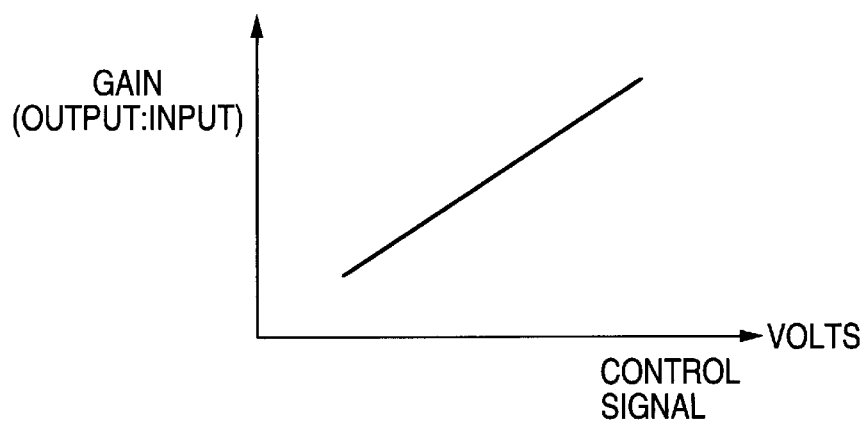
FIG. 2 is a graph of signal gain versus input control signal voltage for an amplifier in accordance with the present invention.

Referring to FIG. 2, the magnitude of the input control signal, by determining the gain of the amplifier and the attenuation of the input attenuator, establishes the overall gain imparted to the input signal to produce the output signal. This results in a monotonic, though not necessarily strictly linear, transfer function whereby as the magnitude of the control signal increases so does the signal gain.

Figure 3:
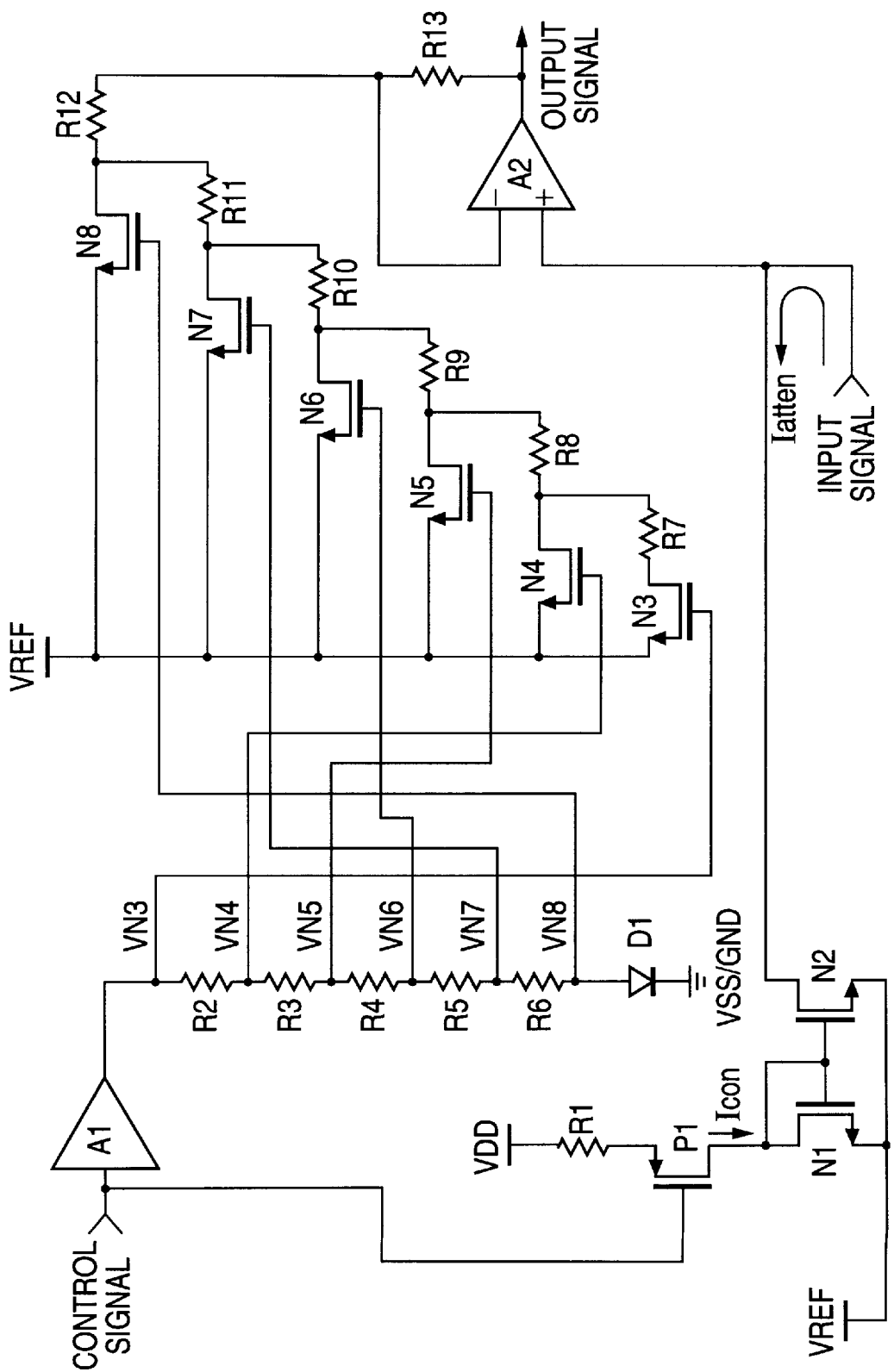
FIG. 3 is a schematic diagram of an amplifier with a monotonic transfer function in accordance with one embodiment of the present invention.

Referring to FIG. 3, one example of an amplifier with a monotonic transfer function in accordance with one embodiment of the present invention is implemented as shown. The control signal is buffered with buffer amplifier A1 to drive a resistive voltage divider consisting of resistors R2–R6 connected in series with a diode D1. (The diode D1 is used to provide some measure of temperature compensation for the resistors R2–R6, which in an integrated circuit implementation and in accordance with well known circuit techniques would typically be implemented with MOS transistors having a static bias voltage applied to their gate terminals.) This, in turn, results in multiple continuously variable voltages VN3–VN8 being generated at the various nodes between the output of amplifier A1 and the anode of diode D1. These voltages, of course, vary in their relative magnitudes such that VN3>VN4>VN5>VN6>VN7>VN8.

These control voltages VN3–VN8 drive the gate terminals of NMOS transistors N3–N8 which are connected in series of their respective associated resistors R7–R12 and in parallel with respective couples of serially connected transistors and resistors N3/R7–N7/R11. (Hence, for example, transistor N6 is connected in series with its associated resistor R10 and is also connected in parallel with the serially-connected transistor N5 and resistor R9.)

With the connections being as shown, regardless of the value of the input control signal and, therefore, the respective values of the various control voltages VN3–VN8, transistor N3 will be turned on more than transistor N4 which, in turn, will be turned on more than transistor N5, and so on. This serial/parallel connection of fixed resistances (resistors R7–R12) and variable resistances (i.e., the drain-to-source, or channel, resistances of variably biased transistors N3–N8) produces an overall continuously variable circuit impedance between the node interconnecting resistors R12 and R13 and the node connecting all of the source terminals of transistors N3–N8 to the reference voltage VREF (e.g., approximately 1.75 volts for a video signal circuit application). This variable resistance, in conjunction with feedback resistor R13, establishes the signal gain for the output operational amplifier A2.

The control signal also drives the gate terminal of PMOS transistor P1 which establishes a control current Icon. (This current Icon is limited by resistor R1 so as to not exceed a predetermined value regardless of how hard transistor P1 is turned on.) This current Icon is the input current for the current mirror circuit formed by NMOS transistors N1 and N2. (Examples of source circuits for the input signal that would perform in conjunction with the input attenuator circuit as described are disclosed in copending, commonly assigned U.S. patent application Ser. No. 09/348,533, filed Jul. 7, 1999 and entitled "Digitally Controlled Signal Magnitude Control Circuit," the disclosure of which is incorporated herein by reference.) Accordingly, this input current Icon is mirrored, or replicated, as the drain current Iatten for output transistor N2. This drain current Iatten is drawn from the source of the input signal via the input terminal. Accordingly, consistent with the graph of FIG. 2, as the control signal amplitude decreases the control current Icon increases, thereby increasing the signal current Iatten drawn from the signal source, thereby, in turn, decreasing the amplitude of the input signal present at the input terminal.

Figure 4A:
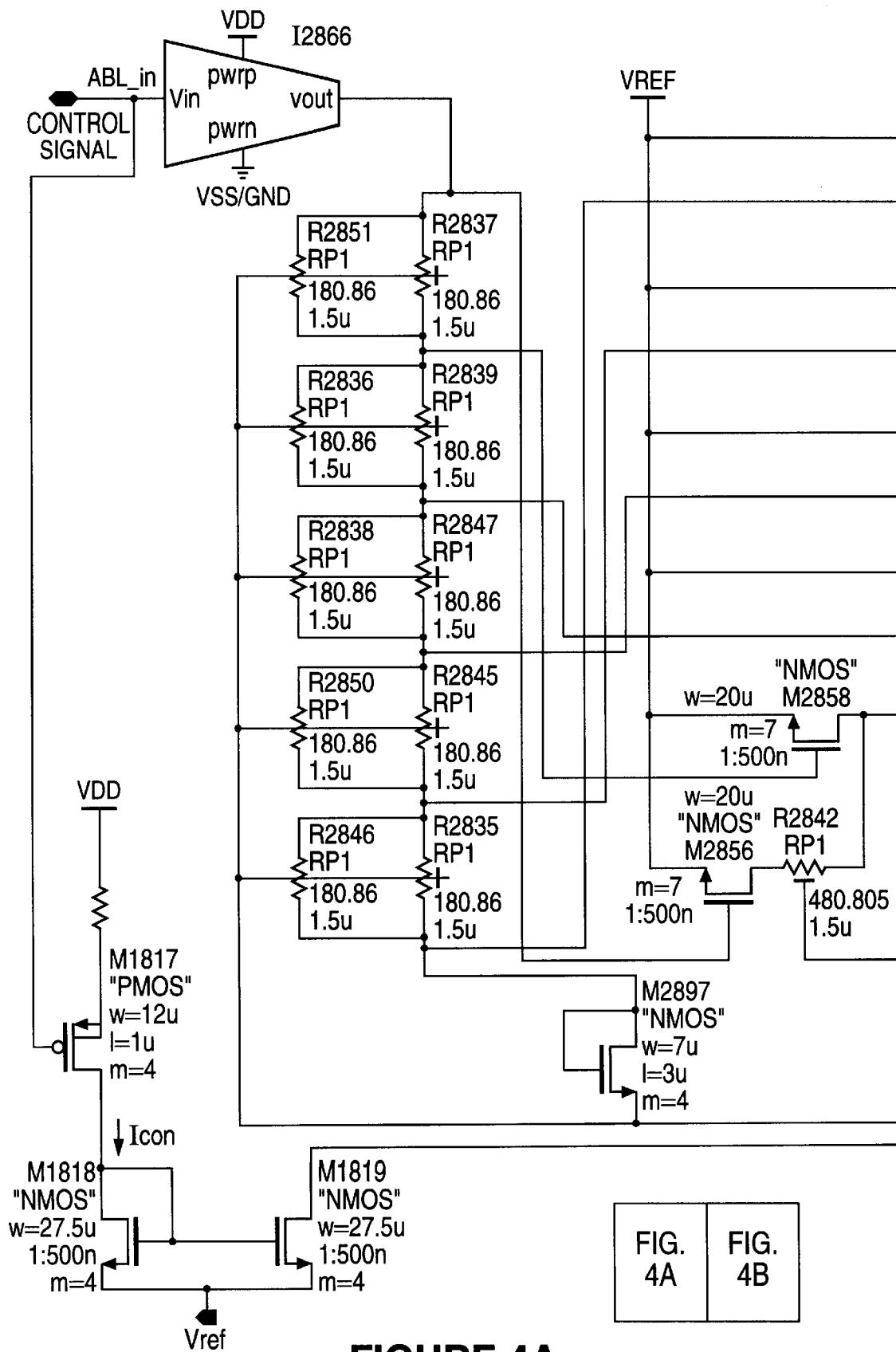
FIG. 4 is a more detailed schematic diagram of a specific implementation of the circuit of FIG. 3.
Figure 4B:
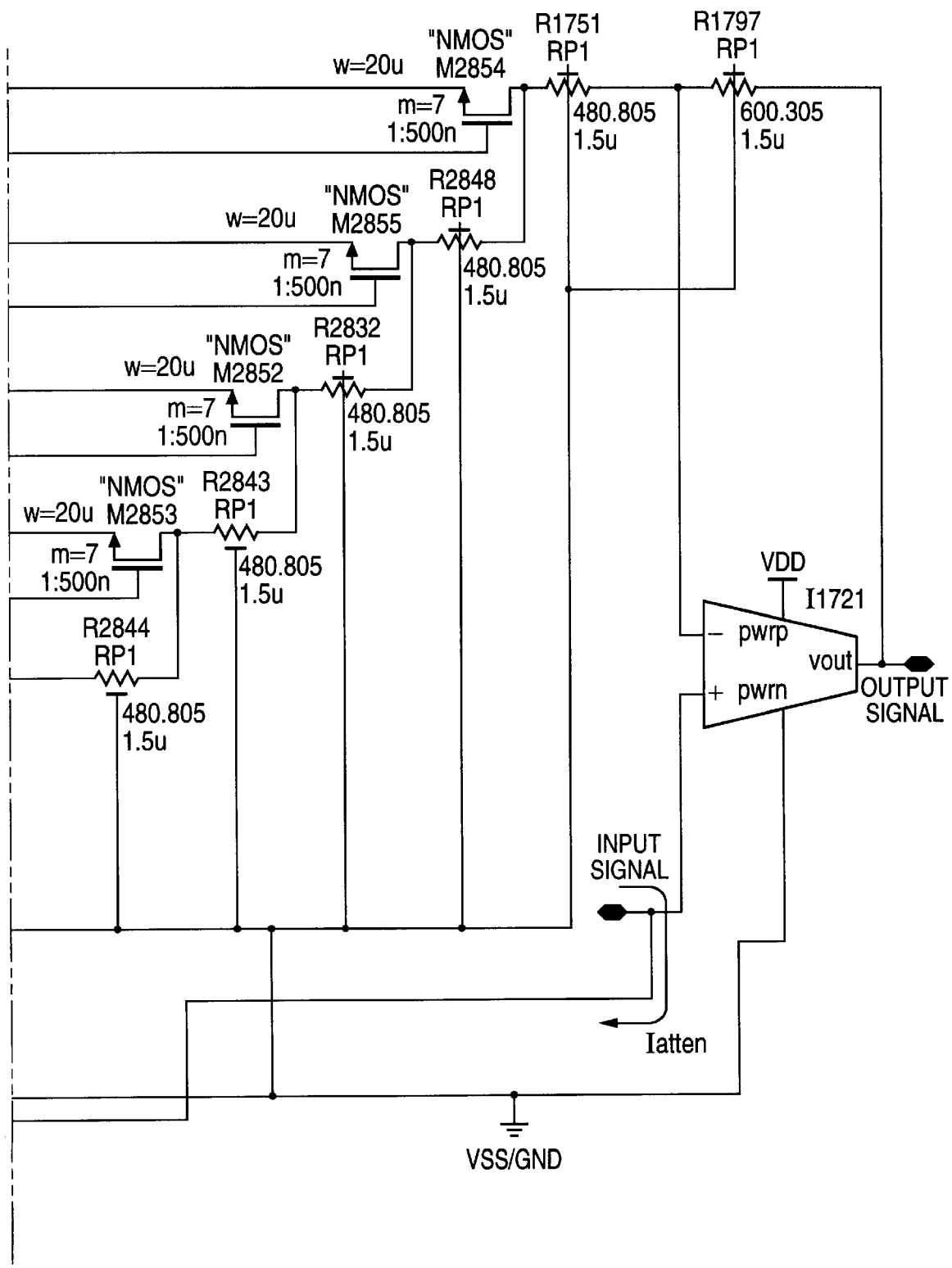

Referring to FIG. 4, one specific implementation of the circuit of FIG. 3 has been simulated using devices and component values as shown. As previously noted, the resistors are implemented using NMOS transistors whose gate terminals are statically biased at the circuit reference potential VSS/GND. The temperature compensation diode D1 is implemented using a diode-connected NMOS transistor.

While the circuit implementations shown in FIGS. 3 and 4 may be preferable for many applications, it will be readily appreciated by one of ordinary skill in the art that the multiple continuously variable control voltages VN3–VN8 needed to control the laddered parallel variable circuit impedances can be generated by other techniques. For example, if the input control signal is in digital form, a digital-to-analog converter with multiple analog output voltages could be used.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an amplifier with a monotonic transfer function, comprising:

a control signal generator circuit that following reception of a variable input control signal generates a plurality of continuously variable discrete analog output control signals having a plurality of respective continuously variable output control signal values including a minimum value, one or more successively greater intermediate values and a maximum value; and a variable gain amplifier circuit, coupled to said control signal generator circuit, that following reception of said plurality of continuously variable discrete analog output control signals receives and amplifies an analog input signal and generates an analog output signal, wherein a ratio of said analog output signal and said analog input signal defines a monotonic transfer function, wherein said variable gain amplifier circuit comprises a variable impedance circuit configured to receive said plurality of continuously variable discrete analog output control signals and in accordance therewith exhibit a corresponding continuously variable circuit impedance, wherein said variable impedance circuit comprises a plurality of fixed resistive circuit elements, and a plurality of variable resistive circuit elements, wherein respective ones of said plurality of variable resistive circuit elements receive respective ones of said plurality of continuously variable discrete analog output control signals, are coupled in series with respective couples of said plurality of fixed resistive circuit elements, and are coupled in parallel with respective couples of said serially coupled variable and fixed resistive circuit elements, and an analog amplifier circuit having an impedance-dependent signal gain, coupled to said variable impedance circuit and configured to receive and amplify said analog input signal and in accordance therewith generate said analog output signal, wherein said monotonic transfer function corresponds to said continuously variable circuit impedance.

2. The apparatus of claim 1, wherein said plurality of variable resistive circuit elements comprises a plurality of MOS transistors.

3. An apparatus including an amplifier with a monotonic transfer function, comprising:

a control signal generator circuit that following reception of a variable input control signal generates a plurality of continuously variable discrete analog output control signals having a plurality of respective continuously variable output control signal values including a minimum value, one or more successively greater intermediate values and a maximum value; and a variable gain amplifier circuit, coupled to said control signal generator circuit, that following reception of said plurality of continuously variable discrete analog output control signals receives and amplifies an analog input signal and generates an analog output signal, wherein a ratio of said analog output signal and said analog input signal defines a monotonic transfer function, wherein said variable gain amplifier circuit comprises a variable impedance circuit configured to receive said plurality of continuously variable discrete analog output control signals and in accordance therewith exhibit a corresponding continuously variable circuit impedance, wherein said variable impedance circuit comprises a plurality of fixed resistive circuit elements, and a plurality of variable resistive circuit elements, wherein respective ones of said plurality of variable resistive circuit elements receive respective ones of said plurality of continuously variable discrete analog output control signals, are coupled in series with respective couples of said plurality of fixed resistive circuit elements, and are coupled in parallel with respective couples of said serially coupled variable and fixed resistive circuit elements, and an analog amplifier circuit having an impedance-dependent signal gain, coupled to said variable impedance circuit and configured to receive and amplify said analog input signal and in accordance therewith generate said analog output signal, wherein said monotonic transfer function corresponds to said continuously variable circuit impedance.

4. The apparatus of claim 3, wherein said plurality of variable resistive circuit elements comprises a plurality of MOS transistors.

5. An apparatus including an amplifier with a monotonic transfer function, comprising:

a control signal generator circuit that following reception of a variable input control signal generates a plurality of continuously variable discrete analog output control signals having a plurality of respective continuously variable output control signal values including a minimum value, one or more successively greater intermediate values and a maximum value;

a variable gain amplifier circuit, coupled to said control signal generator circuit, that following reception of said plurality of continuously variable discrete analog output control signals receives and amplifies an analog input signal and generates an analog output signal, wherein a ratio of said analog output signal and said analog input signal defines a monotonic transfer function; and an output signal terminal, coupled to said variable gain amplifier circuit, for receiving and conveying said analog output signal, wherein said variable gain amplifier circuit comprises a gain control circuit, coupled between said control signal generator circuit and said output signal terminal, configured to receive said plurality of continuously variable discrete analog output control signals and said analog output signal and in accordance therewith generate a feedback signal, and an analog amplifier circuit, coupled between said gain control circuit and said output signal terminal, configured to receive said analog input signal and said feedback signal and in accordance therewith generate said analog output signal.

6. The apparatus of claim 5, wherein said gain control circuit comprises:

a plurality of continuously variable discrete circuit impedances, mutually coupled in a laddered parallel configuration, that following reception of said plurality of continuously variable discrete analog output control signals exhibit a corresponding continuously variable circuit impedance; and a fixed resistive circuit element, coupled to said plurality of continuously variable discrete circuit impedances.

7. The apparatus of claim 6, wherein each one of said plurality of continuously variable discrete circuit impedances comprises:

a fixed resistor; and a MOS transistor which is coupled in series with said fixed resistor, and in parallel with another one of said plurality of continuously variable discrete circuit impedances.

8. The apparatus of claim 5, wherein said analog amplifier circuit comprises a differential amplifier circuit.

9. An apparatus including an amplifier with a monotonic transfer function, comprising:

a control signal generator circuit that following reception of a variable input control signal generates a plurality of continuously variable discrete analog output control signals having a plurality of respective continuously variable output control signal values including a minimum value, one or more successively greater intermediate values and a maximum value;

a variable gain amplifier circuit, coupled to said control signal generator circuit, that following reception of said plurality of continuously variable discrete analog output control signals receives and amplifies an analog input signal and generates an analog output signal, wherein a ratio of said analog output signal and said analog input signal defines a monotonic transfer function; and an input terminal, coupled to said variable gain amplifier circuit, for receiving from a signal source and conveying said analog input signal with an analog input signal magnitude; and a shunt signal attenuation circuit, coupled to said input terminal, that following reception of said variable input control signal generates a sink current which has a sink current magnitude and is drawn from said signal source via said input terminal, wherein said sink current and analog input signal magnitudes vary in relation to said variable input control signal.

10. The apparatus of claim 9, wherein said shunt signal attenuation circuit comprises a current mirror circuit which includes:

an input stage that following reception of said variable input control signal generates a control current with a control current magnitude that varies in relation to said variable input control signal; and an output stage that replicates said control current and generates said sink current.

11. An apparatus including an amplifier with a monotonic transfer function, comprising:

generator means for receiving a variable input control signal and generating a plurality of continuously variable discrete analog output control signals having a plurality of respective continuously variable output control signal values including a minimum value, one or more successively greater intermediate values and a maximum value;

amplifier means for receiving said plurality of continuously variable discrete analog output control signals and receiving and amplifying an analog input signal and generating an analog output signal, wherein a ratio of said analog output signal and said analog input signal defines a monotonic transfer function;

input means for receiving from a signal source and conveying said analog input signal with an analog input signal magnitude; and shunt signal attenuator means for receiving said variable input control signal and generating a sink current which has a sink current magnitude and is drawn from said signal source via said input terminal, wherein said sink current and analog input signal magnitudes vary in relation to said variable input control signal.

\* \* \* \* \*